United States Patent [19]

Michel et al.

[11] Patent Number: 5,759,616
[45] Date of Patent: Jun. 2, 1998

[54] PROCESS FOR PRODUCING MICROSTRUCTURE COMPONENTS ON A SUBSTRATE

[75] Inventors: Andreas Michel, Eggenstein-Leopoldshafen; Michael Harmening, Hirschberg; Walter Bacher, Stutensee; Peter Bley, Eggenstein-Leopodshafen; Robert Ruprecht, Walzbachtal; Alexander Both, Karlsruhe, all of Germany

[73] Assignee: Kernforschungszentrum Karlsruhe GmbH, Karlsruhe, Germany

[21] Appl. No.: 401,770

[22] Filed: Mar. 10, 1995

Related U.S. Application Data

[63] Continuation-in-part of PCT/EP94/00169, Jan. 22, 1994.

[30] Foreign Application Priority Data

Feb. 13, 1993 [DE] Germany ............................ 43 04 424.7

[51] Int. Cl.$^6$ ............................................................ B05D 5/12
[52] U.S. Cl. ......................... 427/96; 204/192.25; 216/13; 216/67; 427/277; 438/1
[58] Field of Search .......................... 427/58, 96, 277; 430/313, 314, 315, 323, 324, 325; 438/1; 204/192.25; 216/13, 67

[56] References Cited

U.S. PATENT DOCUMENTS

| | | | |
|---|---|---|---|
| 5,194,402 | 3/1993 | Ehrfeld et al. | 437/180 |
| 5,576,147 | 11/1996 | Guckel et al. | 430/323 X |

FOREIGN PATENT DOCUMENTS

| | | |
|---|---|---|
| 3937308 | 3/1991 | Germany . |
| 8901632 | 2/1989 | WIPO . |

*Primary Examiner*—Michael Lusignan
*Attorney, Agent, or Firm*—Klaus J. Bach

[57] ABSTRACT

In a process for producing microstructure components on a substrate which carries electronic microcircuits cooperating functionally with the microstructure components, a first layer of a plastic material which connects with the substrate is applied to the substrate and a second layer of a plastic material which includes a separating agent but which firmly connects with the first layer is applied to the first layer and a molding tool is then impressed into the second layer to form the desired microstructures or to form cavities into the plastic material, which, upon removal of the molding tool, are filled with a metal to form the desired microstructures on the substrate upon removal of the plastic material.

9 Claims, No Drawings

PROCESS FOR PRODUCING MICROSTRUCTURE COMPONENTS ON A SUBSTRATE

This is a continuation-in-part application of International application PCT/EP 94 00169 filed Jan. 22, 1994 claiming the priority of German Application P 43 04 424.7 filed Feb. 13, 1993.

BACKGROUND OF THE INVENTION

The present invention resides in a process for producing microstructure components on a substrate having disposed thereon integrated circuits which functionally cooperate with the microstructure components.

With this process microstructure components of plastic material are built up on the substrate which cooperate functionally with the integrated circuits by means of electromechanical or optical coupling devices. Also, metallic microstructure elements may be formed on the substrate which cooperate functionally with the integrated circuit by electrical means.

Such processes are known, for example, from WO89/01 632 AL. In accordance with this publication microsensors with integrated signal processing arrangements can be made, wherein the integrated circuits for the signal processing and the metallic sensor structures coupled therewith are manufactured on a common substrate spatially directly adjacent to each other. For this purpose, the integrated circuits are first manufactured on the substrate in accordance with semiconductor manufacturing methods. First, a conductive layer is deposited on the substrate and is so structured that a galvanic electrode with a surface structure is formed which corresponds to the shape of the sensor structures and the conductive strips and connections for the microcircuits to be formed. Then a layer of an X-ray resist is disposed on the substrate which carries the galvanic electrode wherein the thickness of this layer corresponds to the characteristic height of the sensor structures. By X-ray lithographic procedures negatives of the sensor structures are formed into this layer whereupon a metal or a metal alloy is galvanically deposited on the negatives of the sensor structures utilizing the galvanic electrode. Finally, the substrate with the sensor structures formed thereon is divided into distinct functional units (chips).

With this method it can happen that the microelectronic circuits are damaged by exposure to the X-ray radiation which is necessary for the X-ray lithographic manufacture of the negatives of the sensor structures. Also, the sensor structures are built up adjacent to the circuits so that space must be provided on the substrate for the sensor structures.

From DE 39 37 308 C1 a method for the manufacture of metallic microstructure bodies is known in which negative forms of the microstructure bodies of plastic material are formed on an electrically conductive base plate by means of micro molding techniques and the cavities of the negative form structures are filled galvanically utilizing the electrically conductive base plate as an electrode. This process is characterized by the fact that, for providing the negative molds, a residual layer of the plastic is left at the bottom of the cavities of the negative mold and that this residual layer at the bottom of the cavities is removed by reactive ion etching by means of ions which are accelerated perpendicularly toward the surface of the base plate before the cavities in the negative form are galvanically filled with metal.

It is further known from this patent publication that the plastic material can be applied to the base plate by means of an intermediate layer which serves as a bonding agent.

This process however does not serve for manufacturing microstructure elements on a substrate on which first electronic circuits were disposed which later were to cooperate functionally with the microstructure elements.

In order to coat such a substrate, for example, a processed wafer, various conditions have to be observed.

It is a prerequisite that the microstructure elements adhere firmly to the processed wafer. The adherence of the plastic material of which the microstructure elements consist however must not be so large that problems are encountered during structuring of the plastic layer if a molding tool is used like in DE 39 37 308 C1 already referred to. Such a molding tool should be easily removable from the microstructure elements without damaging the microstructure elements and without removing them from the substrate or weaken their attachment to the substrate. This is problematic because the surface areas by which the microstructure elements are connected to the substrate are generally smaller than those surfaces by which the molded microstructure elements are in contact with the molding tool.

It is therefore an object of the invention to provide a method for the manufacture of the microstructure elements wherein the sensitive electronic circuits on the substrate are not damaged.

SUMMARY OF THE INVENTION

In a process for producing microstructure components on a substrate which carries electronic microcircuits cooperating functionally with the microstructure components a first layer of a plastic material which connects with the substrate is applied to the substrate and a second layer of a plastic material which includes a separating agent but which firmly connects with the first layer is applied to the first layer and a molding tool is then impressed into the second layer to form the desired microstructures or to form cavities into the plastic material, which, upon removal of the molding tool, are filled with a metal to form the desired microstructures on the substrate upon removal of the plastic material.

For the first layer of plastic material polymethylmethacrylate (PMMA) is particularly suitable especially in the form of a casting resin system, although other plastic material such as polyamide (PA), polycarbonate (PC) or polysulfone (PEC) may be used. The first layer provides for a firm connection with the processed wafer as well as the second layer of plastic material deposited subsequently.

If the surface is not sufficiently microrough, an internal adhesion agent is admixed to the first layer material. If PMMA is used as the plastic material, the adhesion agent comprises preferably a compound whose molecules have a reactive methylacrylate group as an end group.

As adhesion agents the compounds hydroethylmethacrylate (HEMA), hydroxyethylmethacrylphosphate (HEMA-P), chloropropyltrimethosilane (CMO) or methacryloxypropyltrimethoxy-silane (MEMO) can be used. The concentration of the adhesion agent in the plastic material of the first layer is preferably in the range of 0.5 to 2% by weight.

The thickness of the first layer is preferably several μm; it may be in the range of 0.5 μm to 50 μm. The first layer thickness should be large enough so that the roughness of the substrate is covered.

The strength of the first plastic layer depends on the microroughness of the surface of the processed wafer or its conductive surface area, the concentration and the type of the adhesion agent in cooperation with the substrate and on the application procedure.

If the first layer is polymerized onto the wafer the pressure and temperature at which polymerization takes place have a large influence on the strength of the layer. A layer poured onto the wafer may, for example, be maintained under pressure during the polymerization by pressing a plate onto the layer. Care must be taken however that the minimum layer thickness is maintained when excess plastic material is squeezed out from under the plate.

After polymerization of the first layer the substrate with the plastic material of the first layer can be tempered even with cold curing systems. In this way, the remaining monomer concentration can be reduced to below 1% and the layer can obtain a high strength. For PMMA tempering, temperatures in the range between 80° C. and 120° C. are suitable. If the layer is tempered at temperatures below the glass transition temperature for a period of 1 to 72 hours followed by a slow cool-down, internal tensions are avoided by the relaxation taking place with this procedure.

As mentioned a second layer is applied onto the first layer of plastic material. To the plastic material for the second layer, however, first an internal separation agent is admixed. A suitable separation agent is, for example, zinc stearate.

The separation agent should be admixed to the plastic material in a concentration of at least 1 wt. %. Since, with increasing separation agent concentration, the adhesion effect of the plastic material decreases but pores are formed in the plastic material at an increasing rate, the separating agent concentration is limited to 4%.

The thickness of the second layer should be greater, by some 10 μm, than the microstructure elements to be formed therefrom especially if the microstructure elements are to cover more than 50% of the surface of the processed wafer, to which the forming faces are applied by the forming tool. The second layer can be applied in the same manner as the first layer.

Next, the second layer is structured by a molding tool. The tool preferably carries microstructures which are complementary to the microstructure elements if the microstructure elements are to consist of plastic material. If the microstructures are to be built up of metal the molding tool preferably carries microstructures corresponding to the microstructure elements. The height of the microstructures corresponds preferably to the height of the microstructure elements to be produced. The tool is so form-copied that exclusively the second layer is provided with the microstructure elements. Because of the content of internal separation agents in the second layer material the tool can be easily removed without damage to the wafer or the microstructure body of plastic material.

If the wafers are not to be provided with microstructure elements of plastic material but with microstructures of metal, the silicon oxide or silicon nitride surfaces of the processed wafers are so structured that the conductor strips of the microcircuit are exposed in those areas on which later the microstructure elements of metal are to be connected functionally to the microcircuit. In subsequent process steps the plastic material microstructures are galvanically formed with a metal, such as nickel, whereupon the plastic material is removed so that microstructure elements remain on the wafer which correspond to those present on the tool.

In this case, a substrate has to be used whose surface to be galvanically covered is at least partially electrically conductive. Preferably, a processed wafer is used as a substrate, which has first been provided, by powder or vapor deposition, with a 2 to 10 μm thick layer of the metal, for example, in the manner as disclosed in the above-referred to patent publication WO 89 01 632 Al. This metal layer may consist, for example, of titanium, tungsten or aluminum. If the titanium is sputtered onto the substrate it is chemically oxidized and the first layer of plastic material with, for example, 2% MEMO is applied. If tungsten oxide or anodically oxidized aluminum oxide (about 10% $H_3PO_4$, $1 A/dm^2$, 5 min, 24° C.) are used as metal layers, no adhesion agent is needed in the first layer of plastic material if PMMA is used as the plastic material.

A first plastic material without internal adhesion agent may be advantageous if the tool structures not only the second layer but extends with front faces into the first plastic material layer, in order to achieve a small remaining layer thickness of the plastic material after shaping. Then, after forming, the time-consuming treatment of the first layer of plastic material for exposing the metal layer is facilitated. In some cases it may even be advantageous if the metal layer is structured by lithography and etching so that the electrically conductive layer is provided, for example, only at those places where it is needed for galvanic deposition or as conductor strips.

The electrically conductive surface of the substrate in this case is exposed before the galvanic deposition of metal takes place, that is, the first layer and if necessary objectionable rests of the second layer are removed where galvanizing should take place. The removal can be achieved as described in the above-cited DE 39 37 308 Cl by oxygen ions directed perpendicularly to the surface. When the first layer of plastic material is removed the galvanic metal deposition may be performed.

Alternatively, it is possible, to provide a layer suitable for the galvanic deposition of metal by coating the front surfaces of the tool, in accordance with the process described in DE 35 37 483 Cl, with a removable electrically conductive layer which, during structuring of the second layer, is transferred to the substrate.

Like in the process referred to initially, the substrate may subsequently be divided into separate chips by mechanical separation processes. In this step, the short circuit established by the conductive layer between the metallic microstructure elements is eliminated. If the substrate is not divided into chips, the electrically conductive layer can be removed by etching where it was not covered galvanically by metal in order to eliminate the electrical short circuits between the metallic microstructure elements.

An essential advantage of the process according to the invention resides in the fact that the microstructure elements can be built up directly on the microcircuits so that a good integration and packing density can be achieved.

The method does not utilize X-ray radiation for making the microstructure elements on a processed wafer since X-rays could negatively affect the functioning of C and MOS circuits.

What is claimed is:

1. A process for producing microstructure components on a substrate which carries electronic microcircuits cooperating functionally with said microstructure components, said method comprising the steps of:
   a) depositing on said substrate a first layer of a plastic material capable to firmly connect with said substrate,
   b) applying to said first layer a second layer of a plastic material which includes a separating agent but which is capable to firmly connect with said first layer,
   c) the thickness of said first and second layers having a height of at least the height of said microstructure components to be produced on said substrate, d) forming said microstructures into said layers of plastic material by impressing a molding tool provided with a microstructured surface into said second layer of plastic material which includes said separating agent, and e) removing said molding tool.

2. A process according to claim 1, wherein said molding tool has microstructures on its surface, which are complementary to the microstructure components to be formed on said substrate.

3. A process for producing microstructure components according to claim 1, wherein the plastic material forming said first layer includes an adhering agent.

4. A process for producing microstructure components on a substrate which carries electronic microcircuits cooperating functionally with said microstructure components, said method comprising the steps of:

a) depositing on said substrate a first layer of a plastic material capable to firmly connect with said substrate, b) applying to said first layer a second layer of a plastic material which includes a separating agent but which is capable to firmly connect with said first layer, c) the thickness of said first and second layers having a height of at least the height of said microstructure components to be produced on said substrate, d) forming microstructured cavities into said second layer of plastic material by impressing a molding tool provided with a microstructured surface into said second layer of plastic material which includes said separating agent, e) removing said molding tool, f) filling said microstructured cavities formed into said plastic material layers with a metal, and g) removing said plastic material selectively with respect to said metal so that microstructured metal components remain on said substrate.

5. A method according to claim 4, wherein the plastic material forming said first layer includes an adhering agent.

6. A method according to claim 4, wherein said molding tool is provided on its surface with microstructures which correspond to the microstructure components to be formed on said substrate.

7. A method according to claim 4, wherein the surface of said substrate to which said layers of plastic material are applied is first provided with an electrically conductive coating.

8. A method according to claim 7, wherein, after said microstructure cavities are formed into said plastic material layers, any remaining plastic material of said first layer remaining in said cavities on said substrate is removed by reactive ion etching so that said electrically conductive surface coating of said substrate is exposed at the bottom of said microstructure cavities.

9. A method according to claim 7, wherein, after said microstructure cavities are formed into said plastic material layers, any plastic material of said first layer remaining in said cavities on said substrate is removed by dusting so that said electrically conductive surface coating of said substrate is exposed at the bottom of said microstructure cavities.

* * * * *